United States Patent [19]

Breiten et al.

[11] Patent Number: 4,836,885
[45] Date of Patent: Jun. 6, 1989

[54] PLANARIZATION PROCESS FOR WIDE TRENCH ISOLATION

[75] Inventors: Charles P. Breiten; David Stanasolovich; Jacob F. Theisen, all of Manassas, Va.

[73] Assignee: International Business Machines Corporation, Armonk, N.Y.

[21] Appl. No.: 189,863

[22] Filed: May 3, 1988

[51] Int. Cl.[4] .................... H01L 21/306; B44C 1/22; C03C 15/00; C03C 25/06

[52] U.S. Cl. .................... 156/643; 156/646; 156/648; 156/653; 156/657; 156/659.1; 156/662; 204/192.37; 437/67; 437/228

[58] Field of Search ............ 156/643, 646, 648, 653, 156/657, 659.1, 661.1, 662; 252/79.1; 204/192.37; 437/62, 67, 72, 228

[56] References Cited

U.S. PATENT DOCUMENTS

| 4,385,975 | 5/1983 | Chu et al. ........................ 156/643 X |
| 4,389,281 | 6/1983 | Anantha et al. ..................... 156/646 |
| 4,506,434 | 3/1985 | Ogawa et al. ................. 156/648 X |
| 4,545,852 | 10/1985 | Barton .................................. 156/643 |
| 4,654,120 | 3/1987 | Dougherty ........................... 156/651 |
| 4,671,851 | 6/1987 | Beyer et al. ..................... 156/648 X |
| 4,671,970 | 6/1987 | Keiser et al. ..................... 430/314 X |

OTHER PUBLICATIONS

Bartush et al., "Dielectric Isolation Planarization," IBM Technical Disclosure Bulletin, vol. 21, No. 5, Oct. 1978, pp. 1868–1869.

Tsang, "Forming Wide Trench Dielectric Isolation," IBM Technical Disclosure Bulletin, vol. 25, No. 11B, Apr. 1983, pp. 6129–6130.

*Primary Examiner*—William A. Powell
*Attorney, Agent, or Firm*—Jeffrey S. LaBaw; Joseph C. Redmond, Jr.

[57] ABSTRACT

A method of planarizing wide dielectric filled isolation trenches formed in the surface of a semiconductor surface is described. A self aligned mask is formed on the thick conformal layer of dielectric in the depressions over the wide trenches to protect the dielectric in those trenches from etching during planarization steps. The mask material is chosen to have etch characteristics different from the dielectric layer and a subsequent planarizing organic layer to allow selective etching of the mask material or dielectric without etching the other materials in the structure.

17 Claims, 2 Drawing Sheets

PLANARIZATION PROCESS FOR WIDE TRENCH ISOLATION

BACKGROUND OF THE INVENTION

This invention relates generally to the planarization of integrated circuit surfaces. More particularly, it relates to the planarization of wide dielectric filled isolation trenches in the surface of a semiconductor substrate.

Trenches filled with dielectric insulating material with as silicon oxide for isolating devices in integrated semiconductor circuits are known to provide significant device density improvements over other isolation techniques. However, where a dielectric or other insulating material has been deposited in a trench, a highly irregular surface can result. If this irregularity is excessive, it can cause anomolous device leakage, reduced isolation integrity, and subsequent metallization defects. Because this effect may be magnified as the result of subsequent processing, it is important for the trenches and the substrate containing the devices isolated by the trenches to be as planar as possible.

Various types of trenches are known in the art. Deep narrow trenches are typically used to isolate one device from another in the integrated circuit. For examples, a trench may isolate one transistor from another. Shallow trenches are utilized to isolate individual elements within a device; e.g., to isolate the base from the collector in a bipolar transistor (source from drain in CMOS FET). Wide trenches are also commonly used in the art and can serve as areas where metallization patterns will be deposited. Shallow, deep, and wide trenches can be used interchangeably to isolate devices.

Typically, these trenches are filled with dielectric materials such as silicon dioxide or silicon nitride. These materials are commonly deposited by conformal coating processes such as chemical vapor deposition (CVD).

In a single integrated circuit, therefore, a variety of trenches can be present, all of which must be filled with dielectric material for isolation and planarized to prevent anomolous leakages or metallization defects. While a relatively narrow trench is relatively easy to planarize with a conformal isolation layer, it is much more difficult to fully planarize a wide trench. A process which will fully planarize a narrow trench will generally remove much of the dielectric from a wide trench.

Various methods have been proposed to planarize wide dielectrically filled trenches in the prior art. One method proposed is to form a wide organic plug, which can be converted to a dielectric, in the deep trench. The organic material, such as resin glass, deposited in the trench is then exposed to electron beam radiation to render it insoluble in a stripping solvent. The excess material is removed in a suitable solvent or etching solution. The plug of organic material is converted to an oxide by heating it in an oxygen ambient. A layer of silicon dioxide is then deposited over the entire substrate and etched back to planarize the surface. This method suffers from the impurities present in the organic material and the need for accurate registration of the electron beam to the trench. Also, an electron beam exposure tool is expensive and its use should be avoided whenever possible to reduce manufacturing costs.

Other methods of filling wide trenches have formed wide dielectric plug in the wide trench by masking a portion of the area above the wide trenches with photorisist. After a conformal coating of dielectric has been deposited over the substrate, a layer of photoresist is applied and patterned using standard photolithography techniques. The wide dielectric plug is formed in the middle of the wide trench by an etch step, essentially converting the wide trench into two narrow trenches at either side of the original wide trench. The narrow trenches are then filled with a second conformal coating of dielectric and photoresist and etch back to planarize the surface. This method requires the use of an expensive photolithography tool and the need to provide accurate registration of the photoresist mask to the trench structure below.

Yet other methods have sought to planarize wide trenches by assuring a layer of photoresist applied to the top of the conformal layer of dielectric is totally planar, and then etching the resist and silicon oxide nonselectively in a 1:1 etch rate ratio. These techniques begin by forming a plug of photoresist over the deep trench, either by standard photomasking techniques or by a self-aligned process, and then apply a second layer of photoresist to achieve a planar surface. These methods suffer from the non-uniform etch properties of resist and the fact that a 1:1 etch ratio is difficult to achieve and maintain in a manufacturing environment. Additionally, a resist layer can form ripples or waves during the planarizing resist reflow or during the reactive etch step itself. These effects combine to cause the dielectric in the wide isolation trench to have a rippled surface, which may not be planar with the surface of the semiconductor substrate if the 1:1 etch ratio is not maintained.

SUMMARY OF THE INVENTION

It is a primary object of this invention to provide an improved method for planarizing wide dielectric filled trenches in the surface of a semiconductor substrate.

It is another object of this invention to provide a self aligned method for planarizing wide dielectric filled trenches.

It is a further object of this invention to provide a method which uses highly selective etches, thereby reducing the process sensitivity to endpoint control and increasing process windows It is yet another object of this invention to provide a method which does not require expensive and time consuming photolithographic techniques to planarize a wide dielectrically filled trench.

These and other objects are accomplished by forming a series of a wide and narrow trenches in the surface of a semiconductor surface using known etching techniques. A first layer of dielectric is conformally deposited over the pattern of wide and narrow trenches in the semiconductor surface. A second layer, preferably of a different dielectric material, is then deposited over the first dielectric. Next, a thick organic layer such as photoresist or polyimide is applied to further planarize the structure. The second layer must be chosen to have sufficiently different etch characteristics from the first layer and the organic layer so that it can function as a etch mask for the first dielectric layer. The organic layer is then etched back to the surface of the second layer above the device areas and the narrow trenches. At this point, some organic material is still left in the depressions above the wide trenches. The second layer is then etched in the areas where it is exposed to form an etch mask protecting the wide trench areas. The first dielectric layer is then exposed in the device and the narrow trench areas. It is then etched with high selectivity to the second layer until endpoint is determined at the semiconductor surface. The masking portions of the second layer are then removed with an etching step or other means. If needed, a second layer of the first dielectric is deposited and etched back to planarize the surface of the semiconductor substrate.

DETAILED DESCRIPTION OF THE DRAWINGS

Figure 1A:
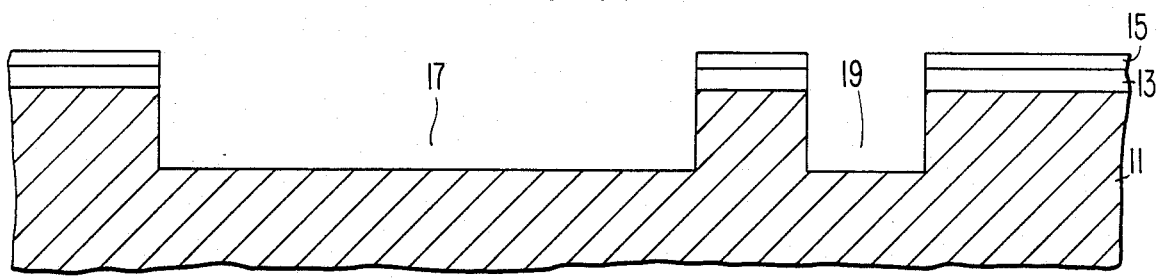
FIG. 1a–1c are schematic cross-sectional views of a semiconductor substrate with wide and narrow trenches etched therein which illustrate the problem of planarizing a wide trench versus a narrow trench.
Figure 1B:
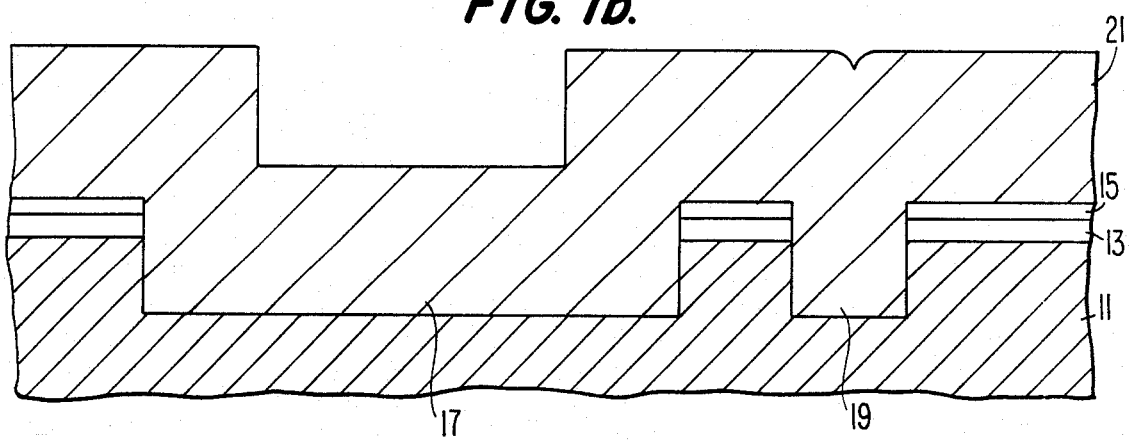
Figure 1C:
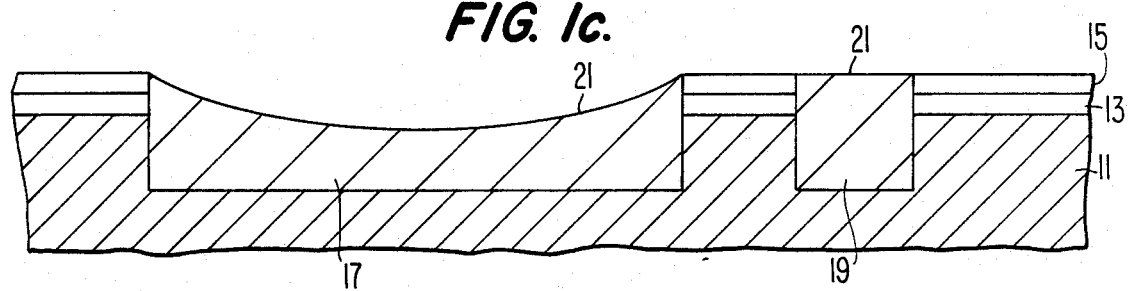

FIGS. 1a–1c illustrate the difficulty experienced in the prior art in planarizing wide dielectrically filled trenches. FIG. 1a illustrates a silicon substrate 11 in which a number of solid state devices such as FETs may be fabricated topped with thermal silicon oxide 13 and CVD silicon nitride 15. Wide trench 17 and narrow trench 19 are etched through the silicon oxide 13 and silicon nitride 15 into the silicon 11 for a total depth on the order of 0.5 microns. FIG. 1b shows a conformal coating of CVD silicon dioxide 21. Note that the silicon dioxide 21 above the narrow trench 19 is nearly planar, while that over the wide trench 17 leaves a large step equal to the depth of the trench. After a planarizing resist and etch is performed, the structure in FIG. 1c results. Wide trenches are defined as trenches with a width that is greater than twice the thickness of the conformal dielectric used to fill the trenches. A narrow trench is any trench with a width less than a wide trench, that is, a width equal to or less than twice the thickness of the conformal dielectric. Since the silicon dioxide 21 deposited is generally only slightly thicker than the trench depth, e.g., with a 0.5 micron deep trench 0.6 micron of dielectric would be used, a wide trench is one greater than 1.2 microns in width. The wider the trench, the more difficult the planarization becomes and, as a result, the more severe problems will be. The silicon dioxide 21 in the wide trench 17 is highly nonplanar and does not completely fill the trench while the narrow trench 19 is completely filled and planar with the silicon nitride layer 15 on top of the substrate 11.

Figure 2A:
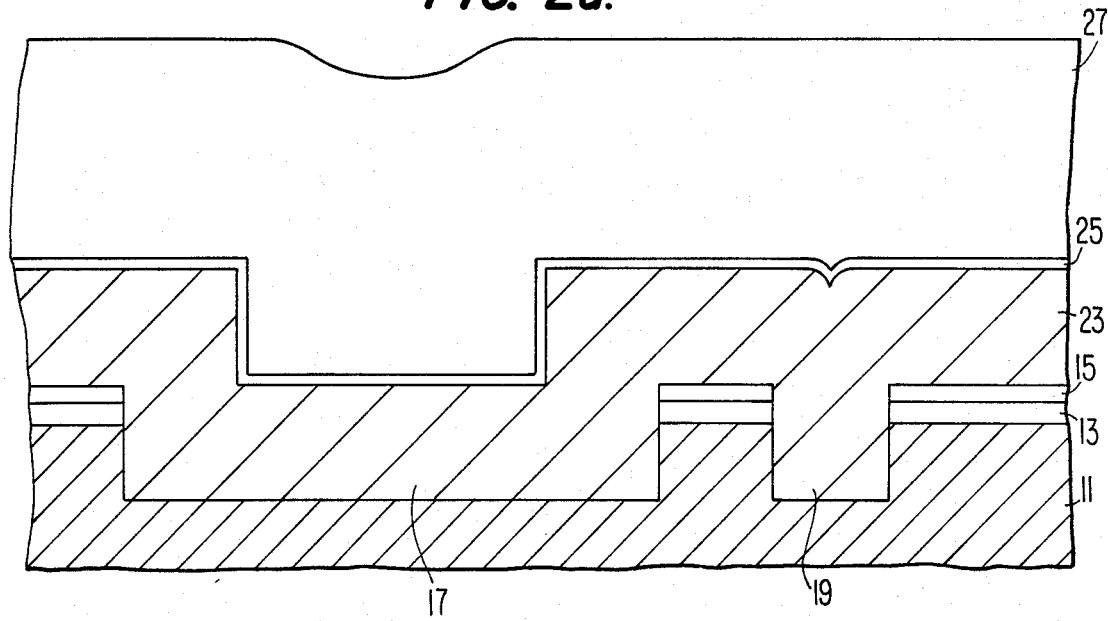
FIGS. 2a–2f are schematic cross-sectional views of a semiconductor substrate at successive points of practicing a preferred embodiment of the present invention.

Referring now to FIGS. 2a–2f, a preferred embodiment of planarizing wide, relatively shallow dielectrically filled trenches according to the present invention is described. It is even more critical to completely fill a shallow trench than a deep trench because of the greater sensitivity to sidewall leakage and threshold voltage imbalances. FIG. 2a shows a semiconductor substrate 11 topped with thermal silicon oxide 13 and CVD silicon nitride 15 into which wide trench 17 and narrow trench 19 have been etched using standard etching techniques. The trenches measure approximately 5000 angstroms in depth, but can range from 3000 angstroms to 7000 angstroms in a shallow trench process. The wide trench 17 in this embodiment measures approximately 2 microns in width but can be over 50 microns in width. The semiconductor substrate 11 could be any compound semiconductor such as GaAs or CdTe, but would most likely be silicon. A conformal first layer of dielectric 23 of approximately 6000 angstroms is deposited over the semiconductor substrate 11. Dielectric layer 23 can be of any dielectric material which can be deposited conformally but is preferably CVD silicon dioxide. Tetra-ethyl-ortho-silicate is a suitable source material for CVD silicon oxide. A second layer or masking layer 25 of approximately 500 angstroms is deposited conformally over the silicon dioxide layer 23. As this layer will be removed in subsequent processing, it need not be a dielectric, however, LPCVD silicon nitride is a preferred material for second layer 25 because of its process compatibility and etch characteristics. A thick organic layer 27 of approximately 1.5 microns is then applied to planarize the entire structure. A positive novalak photoresist material is preferred, however, any material which can provide sufficiently different etch characteristics from the second layer 25 to etch that layer selectively and possesses the necessary planarization properties can be used. The thickness of layer 27 will vary depending upon the material used and how easily it reflows and if any heating is used to more fully planarize the material.

Figure 2B:
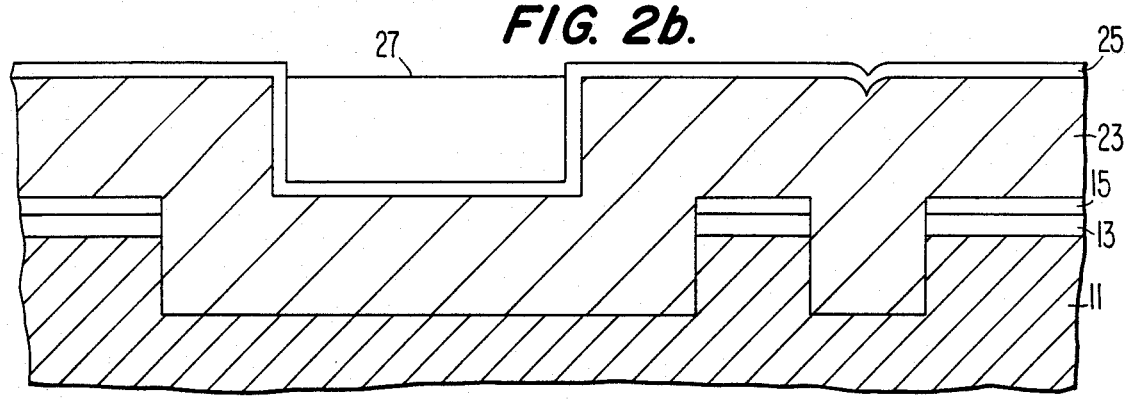

FIG. 2b depicts the cross-section after the photoresist layer 27 has been etched back to the surface of the silicon nitride layer 25 over the device area and the narrow trenches. Note that an amount of photoresist 27 remains in the depressions over the wide trench 17 and cover the silicon nitride deposited there.

Figure 2C:
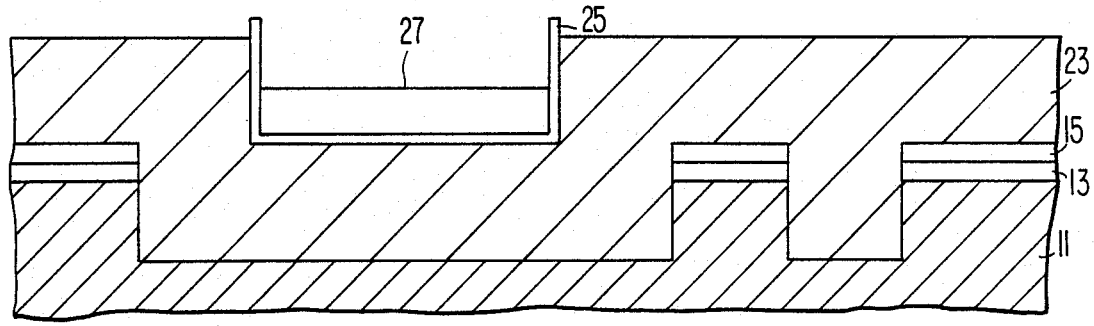

Referring now to FIG. 2c, the exposed areas of the silicon nitride layer 25 are etched away, leaving a mask of silicon nitride 25 over the wide trench areas. Using a photoresist as the organic layer 27 and silicon nitride as the second layer 25 and silicon dioxide as the first dielectric layer 23, a $CHF_3/O_2$ gas mixture may be used for this etch step. In a hexode reactor the following process conditions may be used: power=500 watts, pressure=50 mtorr, $CHF_3$=6 sccm, and $O_2$=44 sccm. These process conditions result in an etch rate ratio between silicon nitride and silicon dioxide of 16:1, thus protecting the silicon dioxide layer 23 from etch during this step.

Figure 2D:
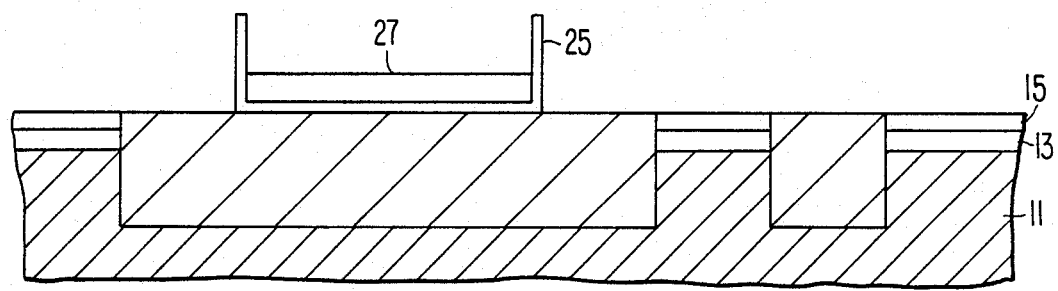

In FIG. 2d, the exposed areas of the silicon dioxide layer 23 are etched with high selectivity with respect to the masking areas of the silicon nitride 25. Using silicon dioxide as the first layer 23 and silicon nitride as the second layer 25, a $CHF_3/CF_4$ gas mixture is recommended. In a hexode reactor, the following process conditions may be used: power=(1000–1400) watts, pressure=(50–70) mtorr, %$CF_4$ in $CHF_3$=(6.0–18.0)%. This results in a etch rate ratio between silicon dioxide and silicon nitride of approximately 8:1. The endpoint is determined when the pad nitride 15 is reached. Optical emission endpoint techniques appear to provide the most accurate results for endpoint determination.

Figure 2E:
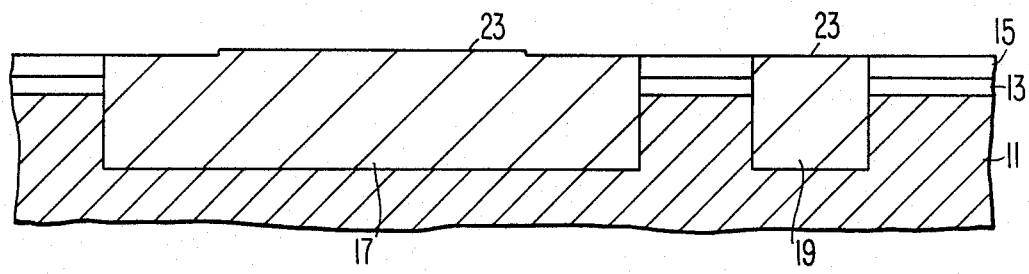

In FIG. 2e, the silicon nitride layer 25 over the wide trenches 17 is removed. This process should be chosen so that the silicon nitride 25 is removed preferentially to the silicon dioxide 23 in the trenches. A hot phosphoric acid dip may be used. Alternatively, a plasma etch in $CHF_3/O_2$ may be used which has a high selectivity between silicon nitride and silicon oxide.

Figure 2F:
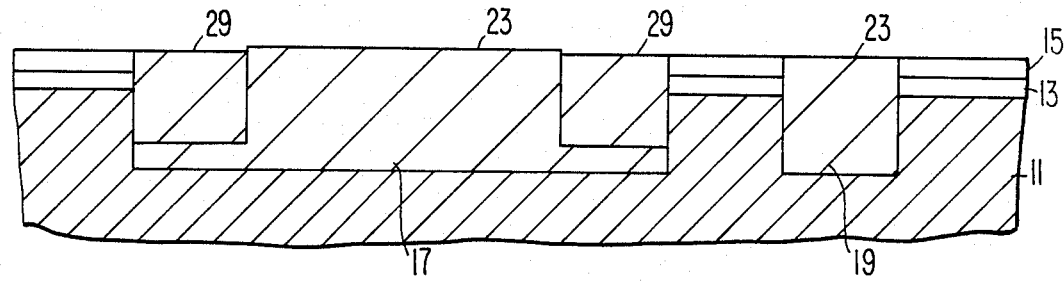

If endpoint cannot be accurately determined, in the silicon dioxide 23 etching may occur to either side of the silicon nitride mask 25. FIG. 2f shows a second layer 29 of silicon dioxide of the second layer 29, which is necessary to fill the wide trench 17 completely. To planarize the second layer of silicon dioxide, a layer of planarizing resist is applied. Then, the silicon dioxide and resist are etched back to the surface of the substrate by standard etching techniques, such as 1:1 nonselective etch between oxide and resist using a $CF_4$ and $O_2$ gas mixture. Alternatively, after the planarizing resist is applied, more esoteric planarizing methods such as an ion beam milling tool can be used to etch the silicon dioxide and resist. Since the surface of the second layer of silicon dioxide is substantially planar, many other known planarizing processes could be used for planarizing the second layer of silicon dioxide. A second dielectric layer is not necessary with a fully optimized process, since the first layer of oxide 23 would be fully planar over the entire trench 17 after the nitride layer 25 is removed in FIG. 2e.

It would be understood by those skilled in the art that many materials could be substituted for those used in the preferred embodiment described above. It is important to select the materials, in the first dielectric layer, the masking layer, and to some degree the planarizing layer, so that highly selective etches may be used. That is, where each of the layers may be etched quickly with little to no etch of the other layers in the structure. A selective process is much easier to control in a manufacturing environment, than a nonselective one which depends upon a strict 1:1 etch rate ratio to accomplish planarization. If there is any drift in the etch rate ratio with time, the planarization will be less affected with a highly selective etch process than a nonselective one.

Using the etch process of the preferred embodiment above, silicon nitride could be used as the first dielectric layer 23 and silicon oxide could be used as the masking layer 25. Other etch processes can be used for silicon oxide and silicon nitride. For example, a $CClF_3$ and $H_2$ gas mixture etches silicon oxide selectively to silicon nitride. If still other etch processes are used, materials, such as oxynitride, metals or polysilicon, could be used as the masking layer 25. Other organic materials such as polyimide or resin glass may be used for layer 27, but also inorganic materials such as reflowable doped glasses, e.g., reflowable boro-phoso-silicate glass, would provide the necessary etching and planarization characteristics for layer 27. In addition, wide trenches much deeper than 0.5 micron can be easily planarized according to the present invention. These above examples are not meant to be exhaustive, but merely illustrative of the range of materials which can be used according to the principles of this method.

Although the specific embodiments of the invention have been disclosed, it will be understood by those of skill in the art that the changes in form and detail may be made without departing from the spirit and scope of the invention.

We claim:

1. A method of planarizing wide dielectric filled trenches in a surface of a semiconductor substrate comprising the steps of:
   depositing a first conformal dielectric layer in said wide trenches and over the surface of said semiconductor substrate, forming depressions on the surface of said first layer over said wide trenches,
   depositing a second layer having etch characteristics which differ substantially from said first layer, on said first layer,
   applying a thick planarizing layer on said second layer,
   etching said thick planarizing layer until the portions of said second layer disposed over said surface of said semiconductor substrate are exposed but leaving portions of said thick planarizing layer in said depressions disposed over the wide trenches,
   etching said exposed portions of said second layer in a etching medium with a high selectivity between said second layer to said first layer, leaving masking areas of said second layer over said first layer deposited in said wide trenches,
   etching said first layer in an etching medium with a high selectivity between said first layer to said second layer to said surface of said semiconductor substrate, and
   removing said masking areas of said second layer.

2. The method recited in claim 1 which further comprises the steps of:
   depositing a second layer of said conformal dielectric layer after removing said masking areas of said second layer, and
   planarizing said second layer of said conformed dielectric layer.

3. The method recited in claim 2 wherein the planarizing step comprises:
   applying a thick planarizing layer on said second layer of said conformal dielectric layer, and
   etching said thick planarizing layer and said second layer of said conformal dielectric layer in a nonselective 1:1 etch rate ratio to said surface of said semiconductor substrate.

4. The method recited in claim 2 wherein the planarizing step comprises:
   applying a thick planarizing layer on said second layer of said conformal dielectric layer, and
   ion beam milling said thick planarizing layer and said second layer of said conformal dielectric layer to said surface of said semiconductor substrate.

5. The method recited in claim 1 wherein said wide trenches have widths greater than twice the thickness of said first conformal dielectric layer.

6. The method recited in claim 1 where said first layer is selected from the group of silicon dioxide and silicon nitride.

7. The method recited in claim 1 where said second layer is selected from the group of silicon nitride, silicon oxide, an polysilicon.

8. The method recited in claim 1 where said thick planarizing layer is selected from the group of photoresist, polyimide, resin glass, or doped reflowable glass.

9. A method of planarizing wide dielectric filled trenches in a surface of a silicon substrate comprising the steps of:
   depositing a first conformal silicon dioxide layer in said wide trenches and over the surface of said silicon substrate, forming depressions on the surface of said first layer over said wide trenches,
   depositing a second layer of silicon nitride on said first layer,
   applying a thick planarizing layer of photoresist on said second layer,
   etching said photoresist until the portions of said second layer disposed over said surface of said silicon substrate are exposed but leaving photoresist in said depressions disposed over the wide trenches,
   etching said exposed portions of said second layer in a etching medium with a high selectivity between said second layer to said first layer, leaving masking areas of said second layer over said first layer deposited in said wide trenches, etching said first layer in an etching medium with a high selectivity between said first layer to said second layer to said surface of said silicon substrate, and removing said masking areas of said second layer.

10. The method recited in claim 6 wherein said exposed areas of said second layer are plasma etched in an ambient of $CHF_3$ and $O_2$.

11. The method recited in claim 6 wherein said first layer is plasma etched in an ambient of $CHF_3$ and $CF_4$.

12. The method recited in claim 6 which further comprises the steps of:

depositing a second layer of silicon dioxide after removing said masking areas of said second layer, and planarizing said second layer of silicon dioxide.

13. A method for making a semiconductor structure which comprises the steps of:

etching a pattern of wide and narrow trenches into a surface of a semiconductor substrate, depositing a first conformal dielectric layer over said surface and in said wide and narrow trenches forming depressions on the surface of said first conformal dielectric layer over said wide trenches, depositing a second layer having etch characteristics which differ substantially from said first layer on said first layer;

applying a thick planarizing layer on said second layer, etching said thick planarizing layer until the portions o said second layer disposed over said narrow trenches and over said surface of said semiconductor are exposed, but leaving portions of said thick planarizing layer in the depressions disposed over said wide trenches, selectively etching said exposed portions of said second layer to expose portions of said first layer disposed over said narrow trenches and said surface of said semiconductor substrate, selectively etching said exposed portions of said first layer, and removing said masking areas of said second layer.

14. The method recited in claim 13 which further comprises the steps of:

depositing a second layer of said conformal dielectric layer after removing said masking areas of said second layer, and planarizing said second layer of said conformal dielectric layer.

15. The method recited in claim 14 wherein the planarizing step comprises:

applying a thick planarizing layer on said second layer of said conformal dielectric layer, and etching said thick planarizing layer and said second layer of said conformal dielectric layer in a nonselective 1:1 etch rate ratio to said surface of said semiconductor substrate.

16. The method recited in claim 14 wherein the planarizing step comprises:

applying a thick planarizing layer on said second layer of said conformal dielectric layer, and ion beam milling said thick planarizing layer and said second layer of said conformal dielectric layer to said surface of said semiconductor substrate.

17. The method recited in claim 13 wherein said wide trenches have widths greater than twice the thickness of said conformal dielectric layer and said narrow trenches have widths less than the widths of said wide trenches.

* * * * *